United States Patent [19]

Burns

[11] 4,454,435
[45] Jun. 12, 1984

[54] CCD AMPLIFIER USING SECOND CORRELATED SAMPLING AND NEGATIVE FEEDBACK FOR NOISE REDUCTION

[75] Inventor: Darrell M. Burns, Sunnyvale, Calif.

[73] Assignee: Hewlett-Packard Company, Palo Alto, Calif.

[21] Appl. No.: 290,749

[22] Filed: Aug. 7, 1981

[51] Int. Cl.³ .................... H03K 3/013; H03K 17/16; H03F 1/26
[52] U.S. Cl. ................... 307/530; 307/353; 307/542; 307/572; 330/9; 377/60
[58] Field of Search ............... 307/530, 491, 501, 520, 307/352, 353, 359, 542, 562, 246, 572, 577; 377/58, 60, 63; 330/9

[56] References Cited

U.S. PATENT DOCUMENTS

| | | | |
|---|---|---|---|
| 3,781,574 | 12/1973 | White et al. | 307/353 X |
| 3,988,689 | 10/1976 | Ochi et al. | 307/353 X |
| 4,066,919 | 1/1978 | Huntington | 307/353 |
| 4,163,947 | 8/1979 | Weedon | 307/491 X |
| 4,211,981 | 7/1980 | Lerma | 307/491 X |
| 4,262,258 | 4/1981 | Gaalema | 307/352 X |
| 4,287,441 | 9/1981 | Smith | 307/353 |
| 4,328,434 | 5/1982 | Geller | 307/359 |

Primary Examiner—Larry N. Anagnos
Assistant Examiner—David R. Hudspeth
Attorney, Agent, or Firm—Edward Y. Wong

[57] ABSTRACT

The present invention provides a circuit for second correlated sampling. By switchably connecting feedback in the circuit, the stage providing the second correlated sampling is precharged independent of an external reference voltage source to make the circuit simpler and hence integratable.

2 Claims, 5 Drawing Figures

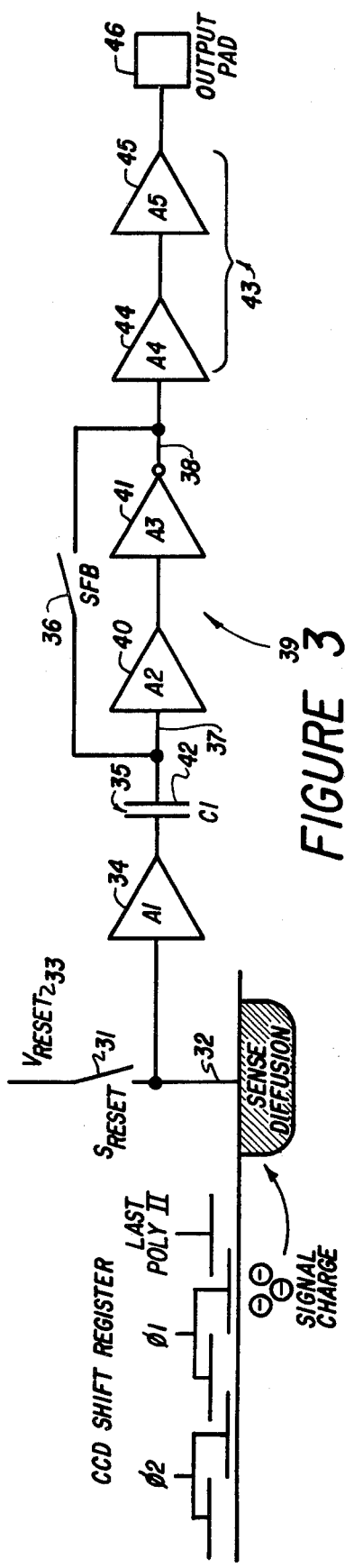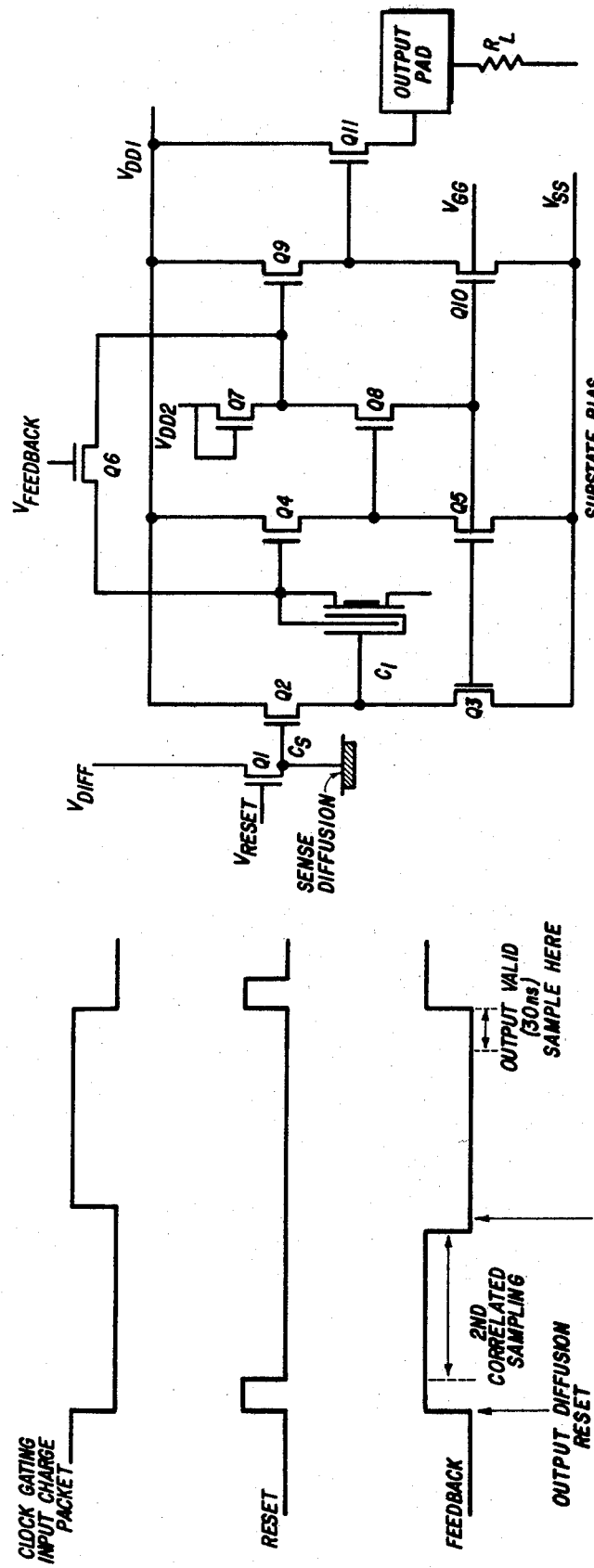

CCD AMPLIFIER USING SECOND CORRELATED SAMPLING AND NEGATIVE FEEDBACK FOR NOISE REDUCTION

BACKGROUND AND SUMMARY OF THE INVENTION

In the process of sensing light with photosensitive semiconductor devices, usually in some array, switching and amplifying circuits are required to process the electrical signal representing the light sensed. The switching and amplifying circuits, however, introduce Nyquist noise during their operation to degrade the sensitivity of the sensor device and consequently the usuable information detected therefrom. The nature of these adverse effects are described by White et al. in their article "Characterization of Surface Channel CCD Image Arrays at Low Light Levels," *Journal of Solid-State Circuits,* Vol. SC-9, No. 1, Feb. 1974. In this article, the authors describe the method of "second correlated sampling" to minimize these adverse effects. This process is also described in U.S. Pat. No. 3,781,574, issued to White et al. and entitled "Coherent Sampled Readout Circuit and Signal Processor for a Charge Coupled Device Array," herein incorporated by reference.

FIG. 1 shows a simplified charge-coupled device (CCD) output structure using second correlated sampling for noise reduction. The circuit operates as follows, where $I_S$ represents the pulse of current resulting from a packet of electrons emanating from the CCD. The output signal from a CCD shift register is the packet of electrons which is collected and stored on capacitor C1. To remove the signal charge from C1 in preparation for the next cycle, switch S1 is closed and capacitor C1 is charged to a reference voltage $V_{R1}$. The thermal noise associated with the finite resistance of switch S1 causes a random variation in the amount of charge on capacitor C1. When switch S1 is opened, a last value of this random charge is stored on capacitor C1. The root-mean-square value of the total spectral noise charge is $\sqrt{KTC1}$, where K is Boltzmann's constant and T is absolute temperature. The root-mean-square voltage is $\sqrt{(KT/C1)}$. After switch S1 opens, a second switch S2 is closed. This charges the input of an amplifier A1 to a second reference voltage $V_{R2}$. The source for voltage $V_{R2}$ is a low impedance supply. During this period of time, a capacitor C2 stores the noise signal on its left plate while its right plate remains at $V_{R2}$. This, of course, is accomplished by amplifier A1 having a gain of unity. Switch S2 is then opened, and the circuit is ready to accept the signal packet from the shift register. The signal is a.c.-coupled onto the right plate of capacitor C2 with no component due to the thermal reset noise. Therefore, the thermal noise of S1 has effectively been eliminated.

In the circuit of White et al. in U.S. Pat. No. 3,781,574, shown herein in FIG. 2, second correlated sampling is accomplished in the manner just described. This prior art circuit, however, has several disadvantages associated with it. One is the extra power supply required to provide the second reference voltage $V_{R2}$. The power supply has to have a constant output and must have a low output impedance in order to quickly charge capacitor C1 with the thermal noise voltage. Another disadvantage is that the second reference voltage to which node N is clamped ($C_N$) does not track with process variation in the semiconductor fabrication of the semiconductor circuit. Thus, if the threshold voltage of transistors within the amplifier connected to the second reference voltage varies, so will the amplifier characteristics. The varying bias conditions causes concomitant fluctuations in gain and frequency response. In the prior art, a typical solution is to use a variable resistor to make adjustments to $V_{R2}$ in each circuit to account for the varying bias conditions. Not only does this solution preclude a simple integrated circuit implementation of a second correlated sampling circuit, it also necessitates troublesome adjustment of individual circuits. Still another disadvantage to this solution is the relative complexity of the circuit; a complex circuit comprising discrete elements tends to be more failure-prone than a simpler circuit comprising integrated elements.

In the present invention, the circuit in accordance with the preferred embodiment overcomes all the above disadvantages. By using negative feedback, this novel circuit dispenses with the requirement of a separate reference power supply for voltage $V_{R2}$. The negative feedback in the novel circuit further insures that bias conditions of the gain stage following the second correlated sampling section remains constant in spite of process deviations during the course of manufacturing. Individual adjustment of the circuit is also dispensed with. Furthermore, the circuit in accordance with the preferred embodiment has fewer circuit elements, such as resistors, which are difficult to fabricate in an integrated circuit. All these advantages in the novel circuit combine to make it fully integratable, thus resulting in a higher performing and more dependable circuit.

Brief Description of the Drawings

FIG. 3 shows a diagram of the preferred embodiment in accordance with the present invention.

FIG. 4 shows the relative timing of the reset and feedback switches to accomplish second correlated sampling in the circuit in accordance with the preferred embodiment of the invention.

FIG. 5 shows an integratable embodiment in accordance with the invention.

Detailed Description of the Preferred Embodiment

Figure 1:
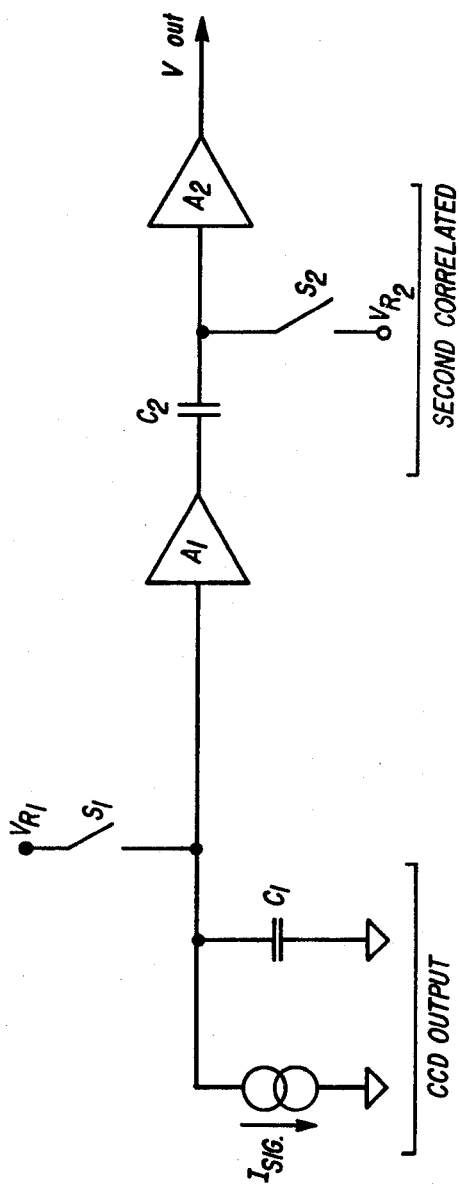
FIG. 1 shows a basic diagram of a second correlated sampling circuit.
Figure 2:
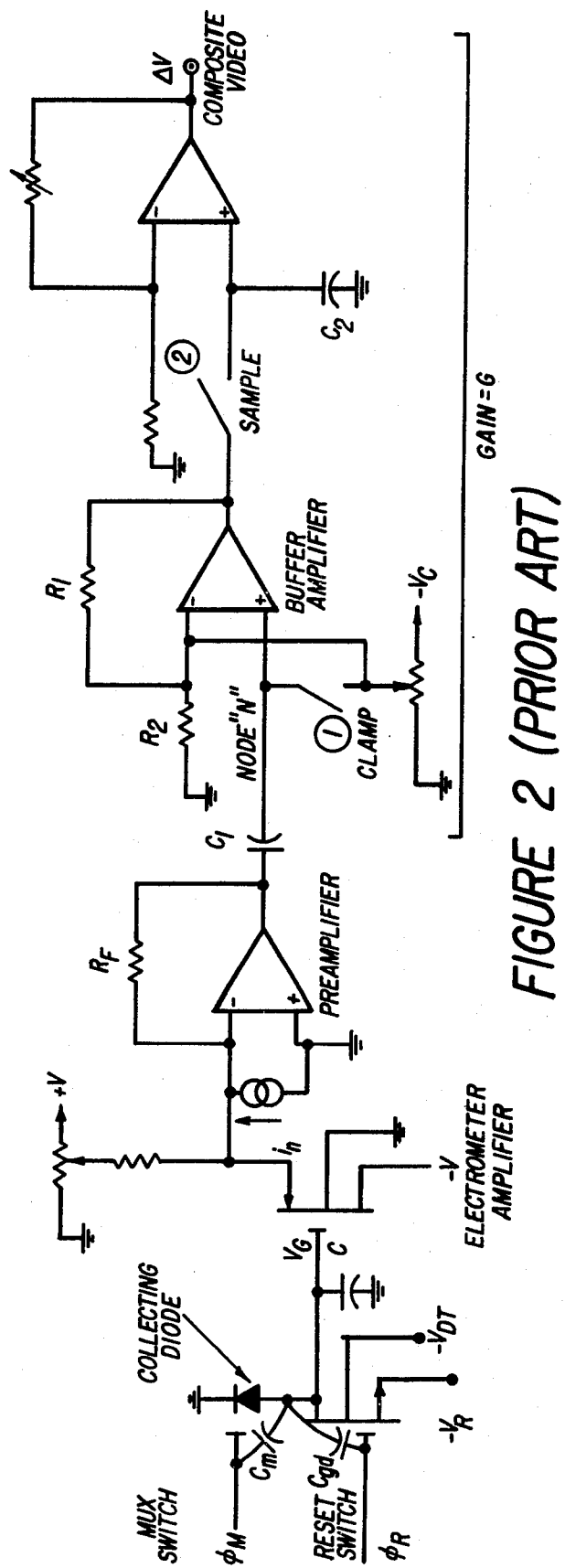
FIG. 2 shows a prior art embodiment of the circuit of FIG. 1.

In the preferred embodiment as illustrated in FIG. 3, a reset switch 31 connected to the output of a photosensitive device 32, such as a CCD shift register, closes to return the sense diffusion in the device output to a first reference voltage $V_{R1}$ 33. Typically a preamplifier 34 or, as in this example, a source follower having a gain of approximately one, is connected to the device output 32. In this way, the low input capacity of the source follower preamplifier 34 provides a high sense diffusion sensitivity. The source follower preamplifier 34 also provides a low output impedance for charging a coupling capacitor 35 during correlated sampling.

From FIG. 3, it is apparent that the capacitor 35 and a feedback switch 36 connected between the input 37 and output 38 ports of a next stage 39 acting in concert provide the following results.

The capacitor 35 acts as a d.c. block and only couples a.c. signals between stages. This allows a high gain amplifier 41 in the coupled stage 39 comprising, in this example, two amplifiers 40, 41, to be biased into the high gain saturation region while the feedback switch 36 is closed. As shown in the timing diagram of FIG. 4, the reset switch 31 and the feedback switch 36 are closed at about the same time. This charges the nodal capacitance at the photosensitive device output 32 to the first reference voltage $V_{R1}$ 33. At the same time, the feedback switch 36 is charging the plate 42 of the coupling capacitor 35 connected to the switchable feedback stage 39 to a second reference voltage determined by the feedback-stabilized d.c. operating voltage of the stage 39. During the time between the opening of the reset switch 31 and the opening of the feedback switch 36, and while the feedback switch is providing a low impedance reference voltage on plate 42, the thermal reset noise of reset switch 31 is stored on the coupling capacitor 35. This sequence accomplishes a second correlated sampling function.

In the preferred embodiment, input amplifier 40 in the coupled stage 39 is another source follower having a gain of approximately unity. This input amplifier 40 provides a low input capacitance so that signal loss due to the capacitive divider effect with coupling capacitor 35 and the input capacitance of the input amplifier 40 is minimized. The input amplifier 40 also has a low output impedance; it is needed to drive the high input capacitance of an inverter 41 connected thereto. This inverter 41 also provides a high gain for the coupled stage 39.

Following the coupled stage 39 in the preferred embodiment is a buffering stage 43 comprising two amplifiers 44, 45. Each of these amplifiers 44, 45 are increasingly larger source followers, each having a gain of approximately unity. This buffering stage 43 enables a higher frequency detected signal to be coupled to a port 46 having large capacitance.

This second correlated sampling circuit in accordance with the preferred embodiment of the invention has the following advantages. No external power supplies or extra devices are required to obtain the second reference voltage required by prior art second correlated sampling circuits; the same components that are used to precharge the coupled stage amplifier to its high gain, high dynamic range state also result in supplying this reference voltage. Furthermore, this circuit in accordance with the invention provides high sensitivity with high speed; source follower sense amplifiers are strategically placed within the circuit to provide the proper impedance and drive needed for achieving this. Also, that the circuit in accordance with the preferred embodiment has only one gain stage results in highest dynamic range and fastest risetime. In short, the circuit in accordance with the invention has simultaneously optimized sensitivity, frequency response, noise level, and dynamic range.

FIG. 5 depicts an integratable embodiment in accordance with the invention. Q1 is the reset switch 31, and Q6 is the feedback switch of FIG. 3. Q2 is the source follower preamplifier 34. Q4 is the input amplifier 40 and Q8 is the high gain amplifier 41 in the coupled stage 39. Q9 and Q11 are other source followers 44, 45 acting as the buffering amplifier 43. Devices Q3, Q5, and Q10 act as current sources for their respective stages.

I claim:
1. A charge signal amplifier circuit comprising:
   a reference voltage source;
   a circuit input port for accepting a charge signal applied thereto;
   a reset switch for selectively connecting said reference voltage source to said circuit input port;
   a first stage, having first input and output ports, coupled at said first input port to said circuit input port for presenting a low impedance to a next stage;
   a capacitance means having first and second plates for coupling said charge signal between stages and for storing thermal reset noise generated by said circuit input port, said first plate being coupled to said first output port;
   a second stage, having second input and output ports, coupled at said second input port to said second plate for amplifying said charge signal coupled thereto;
   a feedback means connecting said second input and output ports for selectively coupling a low-impedance voltage to said second plate whenever said reset switch is closed; and
   a circuit output port amplifier coupled to said second output port for amplifying said charge signal.

2. A method of operating a charge coupled device circuit for providing coherent readout and signal processing of minority carrier signal packets, comprising the sequential steps of:
   turning "on" a semiconductor reset switch to apply a reference voltage across a circuit node capacitance having a common connection with a minority carrier detection circuit;
   reading and holding said reference voltage appearing across said node capacitance by coupling a capacitor from said node capacitance to an inverting amplifier having input and output ports, said input port being connected to said coupling capacitor;
   feeding the output voltage of said inverting amplifier back to its input port, thereby clamping one side of said coupling capacitor to a voltage determined by the feedback-stabilized d.c. operating point of said amplifier;
   turning "off" said reset switch;
   uncoupling the output voltage to said input port;
   charging said node capacitance with minority carrier singal packets to provide a voltage signal;
   coupling said voltage signal to said inverting amplifier through said coupling capacitor; and
   transmitting said coupled voltage signal through said inverting amplifier to provide said coherent readout and signal processing.

* * * * *